United States Patent
Schinzel

(10) Patent No.: US 6,665,808 B1
(45) Date of Patent: Dec. 16, 2003

(54) SYSTEM FOR GENERATING TIMING SIGNAL VARYING OVER TIME FROM AN IDEAL SIGNAL BY COMBINING NOMINAL PARAMETER VALUE SIGNAL AND PARAMETER VARIATION VALUE SIGNAL

(75) Inventor: Peter Schinzel, Gärtringen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/439,001

(22) Filed: Nov. 12, 1999

(30) Foreign Application Priority Data

Nov. 14, 1998 (EP) .............................. 98121724

(51) Int. Cl.[7] ................................. G06F 1/08
(52) U.S. Cl. ..................... 713/501; 713/400; 713/500
(58) Field of Search ................. 713/400, 401, 713/500, 501, 502, 503; 327/261, 263, 276; 375/238, 376; 455/182.1

(56) References Cited

U.S. PATENT DOCUMENTS

| | | | |
|---|---|---|---|
| 4,231,104 A | | 10/1980 | St. Clair |
| 4,476,584 A | * | 10/1984 | Dages ..................... 455/182.1 |
| 4,561,014 A | * | 12/1985 | Douziech et al. ........... 348/507 |
| 4,646,030 A | | 2/1987 | Hollister |
| 4,675,546 A | | 6/1987 | Shaw |
| 4,706,137 A | * | 11/1987 | Tanaka ......................... 360/64 |
| 5,280,195 A | | 1/1994 | Goto et al. |
| 5,361,301 A | | 11/1994 | Robertson et al. |
| 5,365,546 A | * | 11/1994 | Koenck et al. ................. 375/9 |
| 5,471,165 A | | 11/1995 | Liedberg |
| 5,592,659 A | | 1/1997 | Toyama et al. |
| 5,612,981 A | * | 3/1997 | Huizer ........................ 375/376 |
| 5,903,745 A | * | 5/1999 | Nakayama et al. ......... 713/500 |
| 6,037,818 A | * | 3/2000 | Sato ........................... 327/272 |
| 6,104,626 A | * | 8/2000 | Katakura et al. ............. 365/45 |
| 6,115,548 A | * | 9/2000 | Vinson ....................... 713/503 |
| 6,266,711 B1 | * | 7/2001 | Ishikawa et al. ............... 710/8 |
| 6,421,785 B1 | * | 7/2002 | Gryskiewicz et al. ....... 713/500 |

FOREIGN PATENT DOCUMENTS

WO     WO 93/25954     2/1993

OTHER PUBLICATIONS

European Search Report, EP 98 12 1724, Apr. 26, 1999.

\* cited by examiner

Primary Examiner—Thomas Lee
Assistant Examiner—Thuan Du

(57) ABSTRACT

Disclosed is a timing generator including a frequency generator for generating an output signal, and circuitry for providing a nominal parameter setting value to the frequency generator for setting a nominal value of a parameter of the output signal, such as frequency, delay time and/or pulse width. The timing generator further includes a memory for storing predefined parameter setting values, whereby the memory is directly coupled to the frequency generator for directly applying parameter setting values stored in the memory to the frequency generator for modifying the nominal value of the parameter.

11 Claims, 5 Drawing Sheets

SYSTEM FOR GENERATING TIMING SIGNAL VARYING OVER TIME FROM AN IDEAL SIGNAL BY COMBINING NOMINAL PARAMETER VALUE SIGNAL AND PARAMETER VARIATION VALUE SIGNAL

BACKGROUND OF THE INVENTION

The present invention relates to a timing generator according to the preamble to claim 1.

Modern timing generators, in particular pulse generators such as e.g. the Hewlett-Packard HP 81100 family, produce timing signals at precise duration and frequencies, with fast edges and high timing resolution. The generated timing signals can almost be regarded as ideal timing signals.

FIG. 1 depicts in a principle block diagram a timing generator 10 as known in the art. The circuit of FIG. 1 generalizes timing generation features as known e.g. from U.S. Pat. No. 5,592,659, U.S. Pat. No. 4,231,104, U.S. Pat. No. 5,280,195, U.S. Pat. No. 4,675,546, U.S. Pat. No. 4,646,030, U.S. Pat. No. 5,361,301, or WO 93/25954. The timing generator 10 comprises as functional units a frequency generator 20, a controllable delay unit 30, and/or a controllable pulse width unit 40. The parameter setting of the frequency generator 20, the delay unit 30 and/or the pulse width unit 40 is controlled by a microprocessor interface 50 via respective converters 60, 70 and 80 (e.g. digital analog converters DACs). The microprocessor interface 50 represents any type of (miniature) electronic device containing memory, arithmetic, logic, and control circuitry necessary to perform functions of a digital computer's central processing unit, such as interpreting and executing program instructions as well as handling arithmetic operations.

In accordance with the parameter setting, as provided by the microprocessor interface 50 via the converter 60, the frequency generator 20 provides a timing signal at a substantially constant frequency. The delay unit 30 and/or the pulse width unit 40 might change the timing signal delivered from the frequency generator 20 in accordance with their respective parameter setting, as provided from the microprocessor interface 50 via the converter 70 or 80, respectively. Frequency, delay time and/or pulse width of an output signal output of the timing generator 10 can thus be controlled and remain substantially constant unless newly programmed.

For re-programming the timing signal output of the timing generator 10, the microprocessor interface 50 reads out values e.g. from predefined tables, equates from those read out values parameter setup values for setting one or more parameters of the timing generator 10 to specific values, and respectively provides those parameter setup values via the respective converters 60–80 to the frequency generator 20, the delay unit 30 and/or the pulse width unit 40. This re-programming scheme requires a certain amount of time until the respective parameter setup values have been determined/gathered and provided to the respective units, so that the timing of the timing generator 10 cannot be changed fast.

In real environment situations, today's high-speed signals cannot be considered as ideal. Due to a variety of influences on the signals, the real world signals might considerably deviate from the ideal signals. Such influences might be random jitter, synchronization jitter e.g. from PLL circuits, modulations, and/or timing impairs. On the other hand, with increasing speed of designs, timing margins are decreasing. The result is that the impact of signal-disturbing influences becomes increasingly critical.

In testing environments for testing the performance and characteristics of electronic circuits, those circuits are generally tested with more or less ideal signals. This, however, might lead to the situation that the tested electronic circuit well behaves in the artificial, ideal testing environment but causes failures or other irregularities in its real environments.

In order to simulate/emulate real timing behaviors, arbitrary waveform generators might be applied. Such arbitrary waveform generators, such as the Tektronix AWG500 family, provide programmable waveforms allowing to simulate real environment waveforms in a testing environment. Arbitrary waveform generators, however, find a limitation in their applicable frequency range due to the fact that programmable waveforms can only be generated at signal repetition rates smaller than about one tenth of the sampling rates. Thus, arbitrary waveform generators are often not applicable for high-speed environments. Moreover, arbitrary waveform generators are normally more costly with respect to the same achievable speed performance.

SUMMARY OF THE INVENTION

It is therefore an object of the present invention to provide a timing generator applicable to simulate real environment conditions for high-speed signals. The object is solved by the independent claims. Preferred embodiments are shown by the dependent claims.

According to the present invention, parameter setting for parameters such as frequency and/or timing characteristics (e.g. delay time and/or pulse width) of the output signal of the timing generator is accomplished by providing nominal parameter values and, in addition thereto, parameter variation values. While the 'nominal' characteristics (such as frequency and/or timing) of the output signal is determined by the nominal parameter values, the parameter variation values are used to modify or vary the 'nominal' characteristics. This separation of parameter setting, in particular in conjunction with a direct application of the nominal as well as the variation values, allows simulating real environment conditions even for high-speed signals.

BRIEF DESCRIPTION OF THE DRAWINGS

Other objects and many of the attendant advantages of the present invention will be readily appreciated and become better understood by reference to the following detailed description when considering in connection with the accompanied drawings. Features that are or can be built up substantially equally or similarly are referred to with the same reference sign.

DETAILED DESCRIPTION OF THE INVENTION

Figure 1:
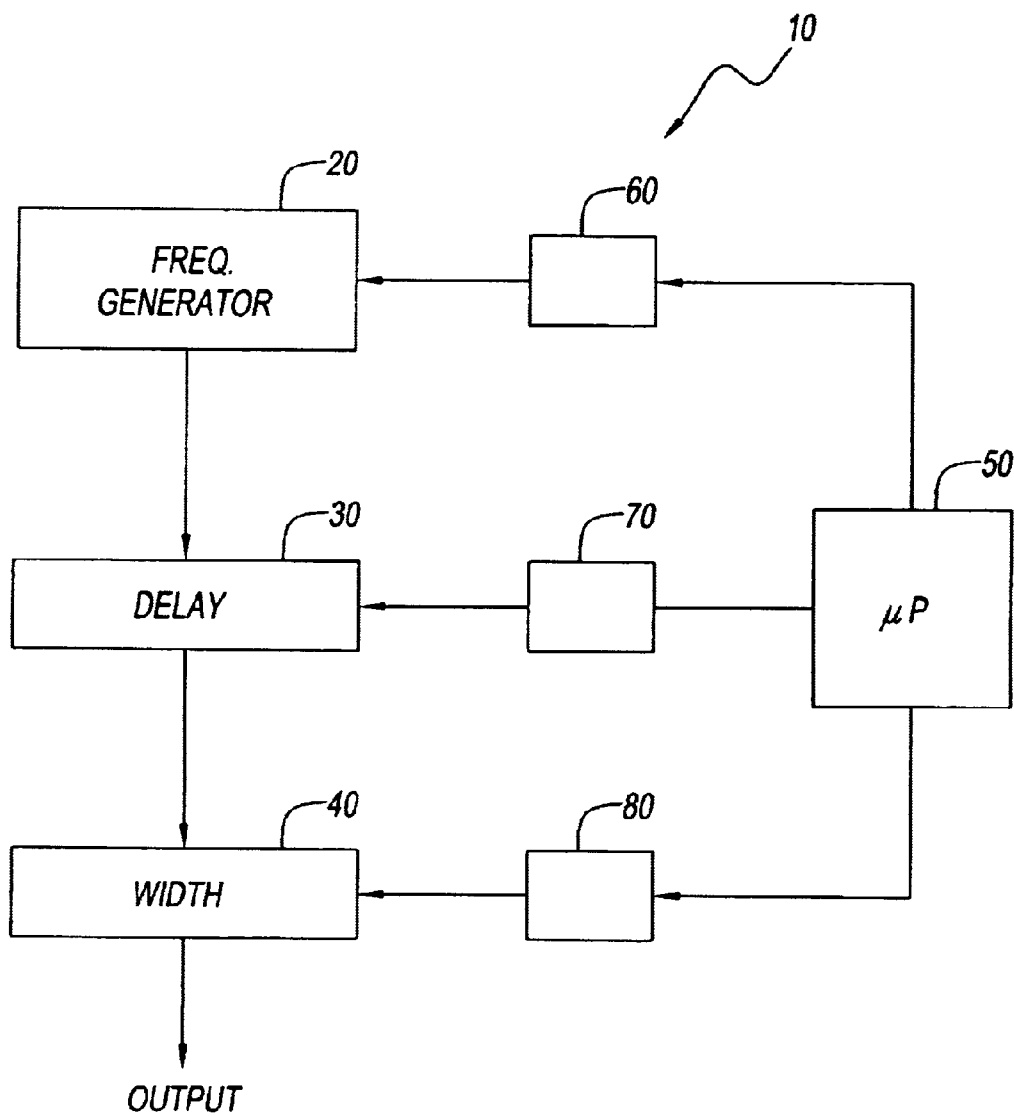
FIG. 1 depicts a timing generator 10 as known in the art.
Figure 2:
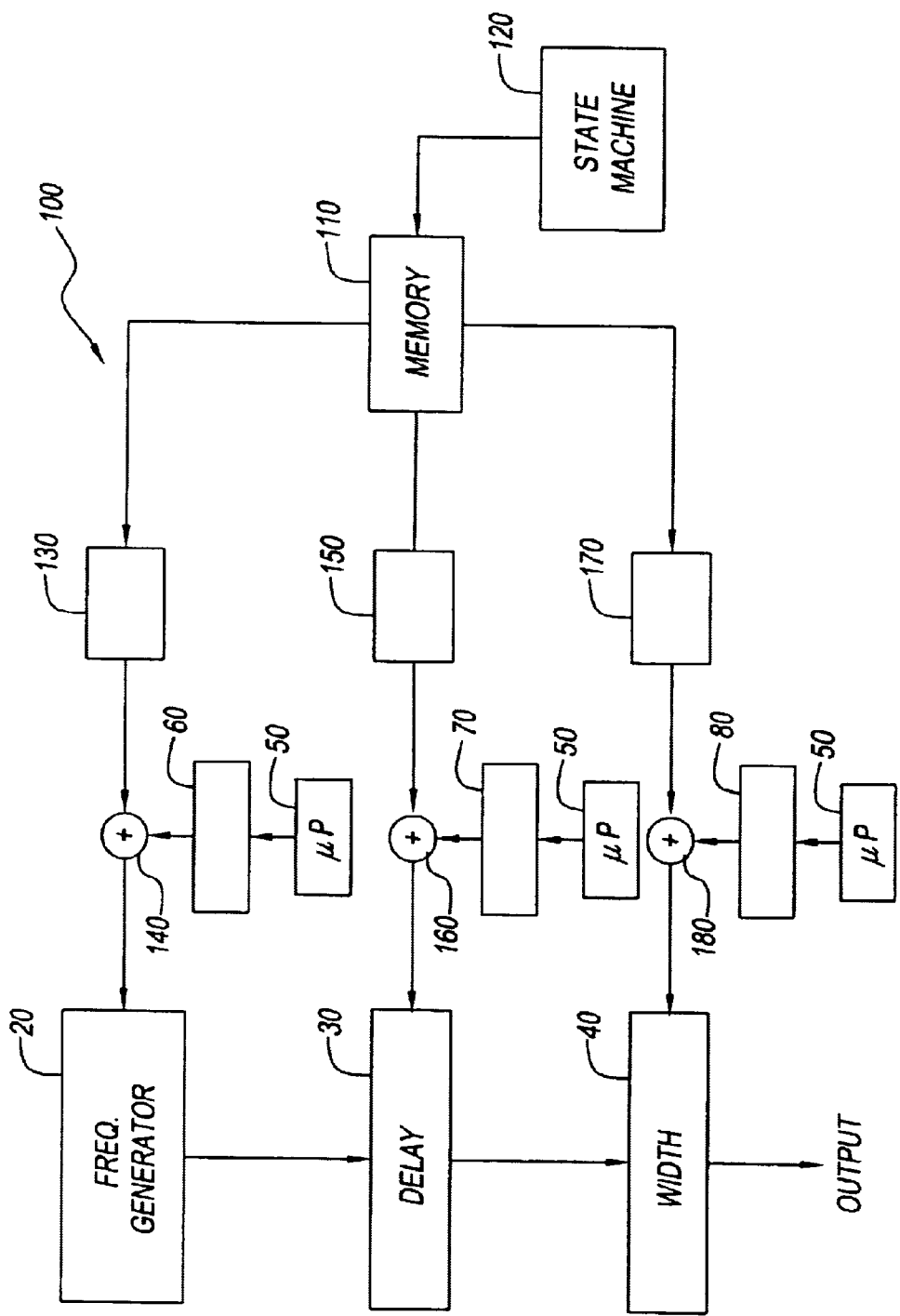
FIG. 2 illustrates a timing generator 100 according to the invention.

FIG. 2 illustrates in a principle block diagram a timing generator 100 according to the invention. The timing generator 100 comprises as functional unit the frequency generator 20 receiving parameter setting values from the microprocessor interface 50 via the converter 60. The output signal from the frequency generator 20 might be coupled to other functional units such as the controllable delay unit 30 and/or the controllable pulse width unit 40. As explained for FIG. 1, the frequency generator 20, the delay unit 30 and the pulse width unit 40 receive respective parameter setting values from the microprocessor interface 50 via respective converter circuits 60, 70 and 80 for setting the frequency, delay and/or pulse width to their nominal values.

In contrast to the timing generator 10 as depicted in FIG. 1, the timing generator 100 further comprises a memory 110 allowing to directly provide parameter setup values to the frequency generator 20, the delay unit 30 and/or the pulse width unit 40, in addition to the parameter setup values from the microprocessor interface 50. The memory 110 is preferably controlled by a state machine 120 generating addresses for the memory 110. The content of the memory 110, corresponding to an applied address, is read out and directly supplied via a converter 130 and a coupling unit 140 to the frequency generator 20, via a converter 150 and a coupling unit 160 to the delay unit 30, and/or via a converter 170 and a coupling unit 180 to the pulse width unit 40.

While the converter 60 preferably provides the parameter setup values for the nominal frequency for the frequency-generator 20, the converter 130 preferably provides the parameter setup values for frequency variations versus time of the frequency-generator 20. The coupling unit 140 couples both signals and provides them to the frequency generator 20. Accordingly, the converter 70 preferably provides the parameter setup values for the nominal delay for the delay unit 30, and the converter 150 preferably provides the parameter setup values for delay variation versus time. The coupling unit 160 couples both signals and supplies the results to the delay unit 30. Finally, the converter 80 preferably provides the parameter setup values for the nominal pulse width for the pulse width unit 40, while the converter 170 preferably provides the parameter setup values for pulse width variations versus time. Both signals are coupled by the coupling unit 180 and supplied to the pulse width unit 40.

The converters 60, 70, 80, 130, 150 and 170 are preferably selected to be digital analog converters (DAC). Preferably, the converters 60, 70 and 80 are optimized on high resolution, while the converters 130, 150 and 170 are optimized on speed. The converters shall represent any kind of interface allowing to adapt a data format of the memory 110 or the microprocessor interface 50 to a data format required for the respective functional unit(s) 20–30. It is clear that in case the formats already match the converters become obsolete. Further more, the respective converters can be concentrated to one or more converting units. The representations of the converters in FIGS. 1 and 2 shall only depict their principle functionality of format conversion/adaptation.

The coupling units 140, 160 and 180 can be embodied by any unit allowing to combine the respective signals, such as adders or subtractors.

The state machine 120, preferably implemented by a counter and/or a sequencer, provides an address sweep for the memory 110. The memory 110 contains already defined parameter setup values allowing to directly and thus quickly modify the parameter setup values of the frequency generator 20, the delay unit 30 and/or the pulse width unit 40. While the microprocessor interface 50 individually determines the parameter setup values, the memory 110 contains already defined parameter setup values, thus allowing to much quicker change the parameter setup of the frequency generator 20, the delay unit 30 and/or the pulse width unit 40. Even if the microprocessor interface 50, in best case, simply reads out the parameter setup values from its memory, the applying scheme for the parameter setup values according to the invention by directly applying the parameter setup values from the memory 110 to the functional units will still be much faster since it avoids the additional reading out step of the microprocessor interface 50.

Figure 3A:
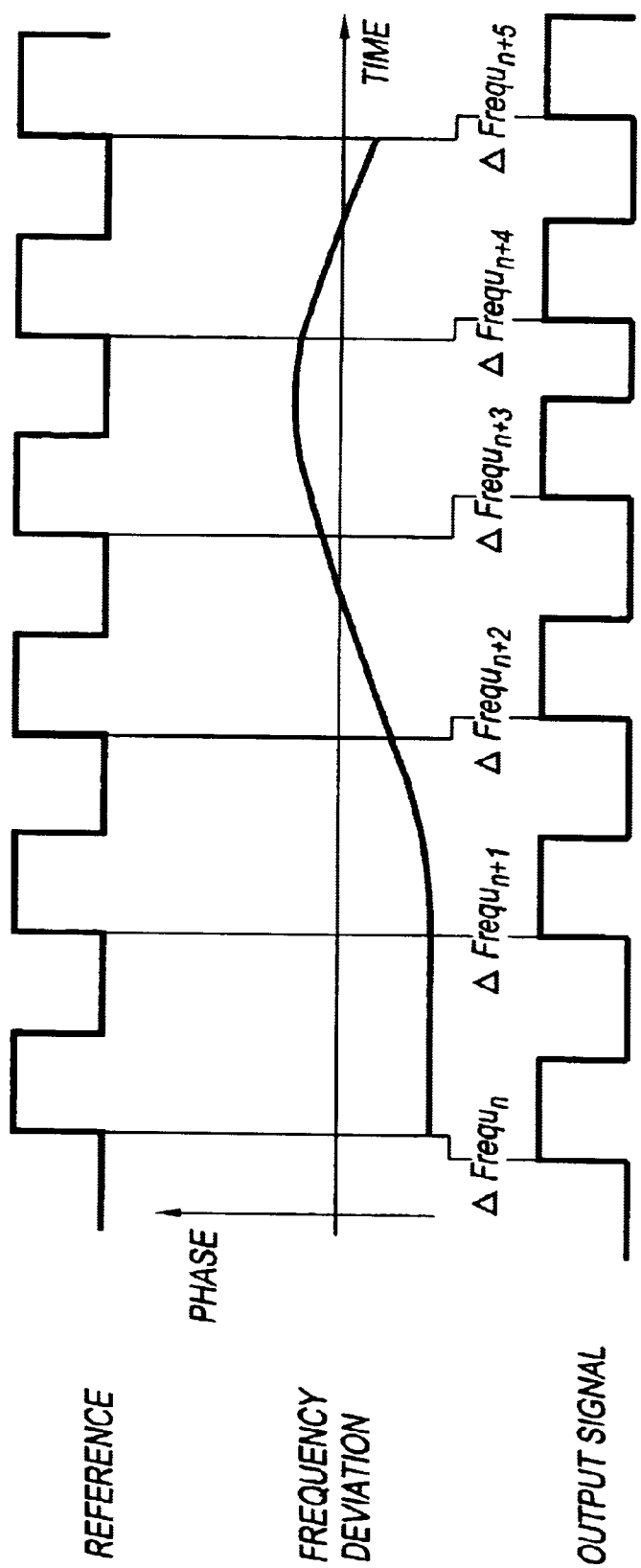
FIGS. 3A, 3B and 3C show examples of the modification of ideal timing signals in accordance with the invention.
Figure 3B:
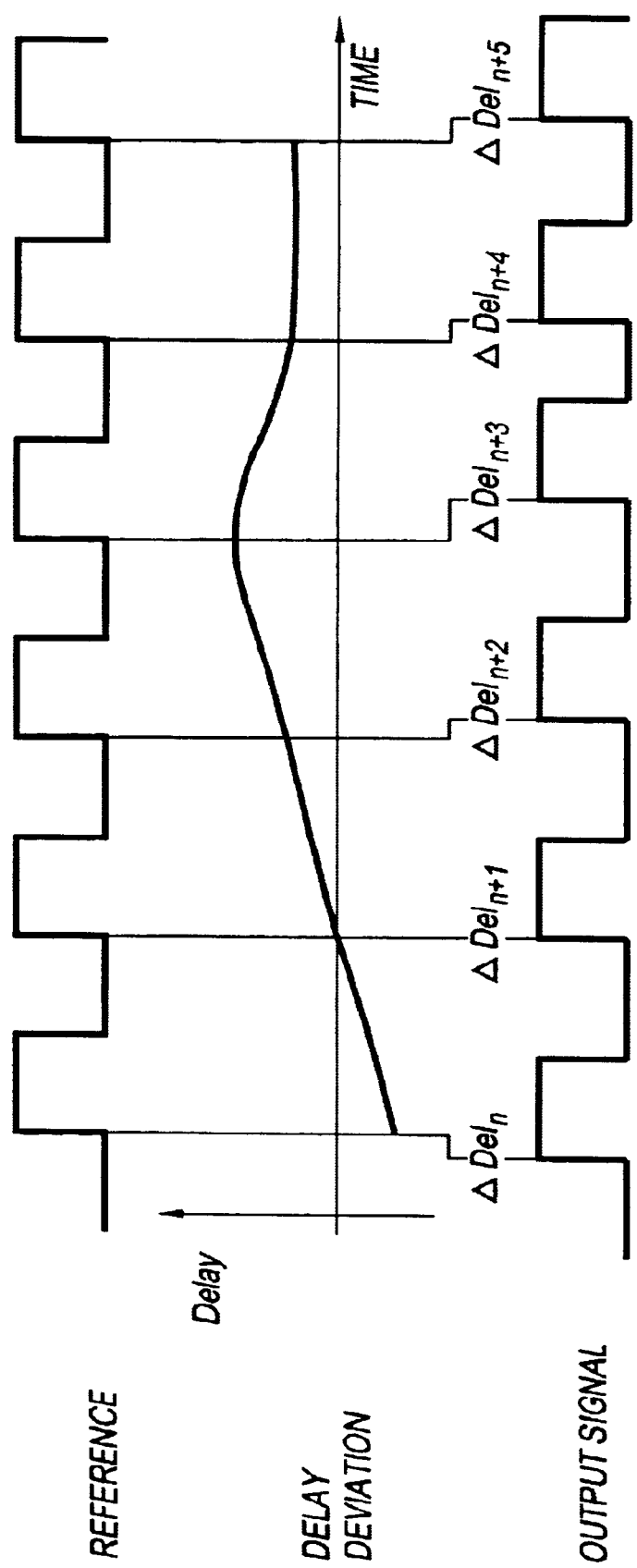
Figure 3C:
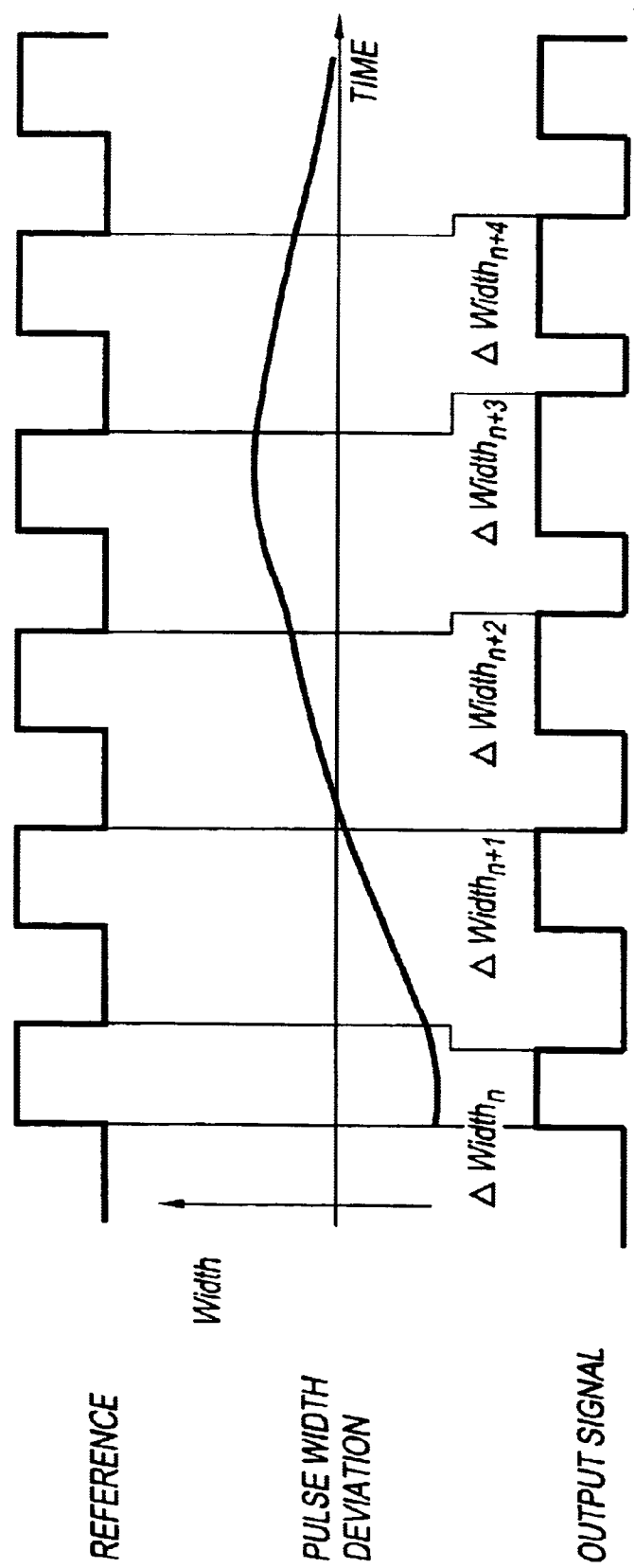

FIGS. 3A, 3B and 3C show examples of the modification of ideal timing signals (upper parts of FIGS. 3A, 3B and 3C) in accordance with the invention. The frequency of a reference signal REFERENCE (upper part of FIG. 3A) is changed over the time according to a frequency deviation scheme shown in the middle part of FIG. 3A. The output signal, changed in frequency with respect to the reference signal REFERENCE, is depicted in the lower part of FIG. 3A. In accordance with FIG. 3A, FIG. 3B depicts the modification of the delay time as set out in the middle part of FIG. 3B. The resulting output signal is depicted in the lower part of FIG. 3B.

From the lower parts of FIGS. 3A and 3B, it is apparent that both, frequency deviation and delay deviation, can lead to the same result for the output signal. In cases where the delay time is larger than the period of the frequency, the frequency modification of FIG. 3A will normally be of advantage while the delay time modification of FIG. 3A will be more advantageous when the delay is only a fraction of the period of the frequency is greater than the delay time.

FIG. 3C depicts the modification of the pulse width as set out in the middle part of FIG. 3C. The resulting output signal is depicted in the lower part of FIG. 3C.

It is clear, that the variation of one parameter (frequency, delay or pulse width) might be sufficient for some applications, so that at least one of the parameter setup deviation means (frequency, delay, pulse width) as depicted in FIG. 2 might be sufficient. However, one or more of the parameters (frequency, delay or pulse width) can be modified also in combination.

The memory 110 in combination with the state machine 120 allows providing a huge variety of parameter setup sweeps. Any memory-addressing scheme as known in the art can be applied for the purpose of the invention, such as serially sweeping the content of the memory 110 or jumping between different addresses. The sweeping of the content of the memory 110 is preferably accomplished in accordance to a predefined testing scheme. However, a stochastic, random or pseudo random sequence sweeping might also be applied.

The memory 110 can be loaded, as known in the art, before or during application, e.g. via the microprocessor interface 50.

It is clear that instead of applying one memory 110 for each functional unit of the frequency generator 20, the delay unit 30 and/or the pulse width unit 40, each functional unit can be coupled to an independent memory. Accordingly, the memory 110 or each individual memory for each functional unit might be controlled by a central state machine 120 or by individual state machines allowing to independently sweep the parameters.

The circuit of FIG. 2 is preferably adapted to set an 'ideal' signal via the microprocessor interface 50 and to modify the 'ideal' signal into a more 'real' signal by means of the memory 110 in conjunction with the state machine 120. However, it is clear that the parameter setting of the timing generator 100 can also be directly accomplished by reading out parameter setup values stored in the memory 110. This, however, requires higher demands on resolution and speed.

What is claimed is:

1. A timing generator comprising:

a frequency generator for generating an output signal;

a microprocessor for generating a nominal parameter value signal;

a memory for storing and generating a parameter variation value signal; and a coupler for combining said nominal parameter value signal and said parameter variation value signal and providing the combined signals to said frequency generator, to cause said output signal from said frequency generator to vary over time from an ideal signal produced by said nominal parameter value signal alone.

2. The timing generator of claim 1, further comprising:

a delay unit connected to said frequency generator for delaying said output signal, wherein said delay unit receives a nominal parameter value signal from said microprocessor and a parameter variation value signal from said memory for causing the delay time of said output signal to vary over time.

3. The timing generator of claim 1, further comprising:

a pulse width unit connected to said frequency generator for setting a pulse width of said output signal, wherein said pulse width unit receives a nominal parameter value signal from said microprocessor and a parameter variation value signal from said memory for causing said pulse width of said output signal to vary over time.

4. The timing generator of claim 1, further comprising a state machine coupled to said memory for providing an address sweep to said memory to generate said parameter variation value signal.

5. The timing generator of claim 1, wherein said parameter is selected from the group consisting of: frequency, delay time and pulse width of said output signal.

6. A method for providing a non-ideal timing signal from a frequency generator, comprising:

generating a nominal parameter value signal;

generating a parameter variation value signal;

coupling said nominal parameter value signal and said parameter variation value signal; and providing the coupled signals to said frequency generator, to cause said output signal from said frequency generator to vary over time from an ideal signal produced by said nominal parameter value signal alone.

7. The method of claim 6, further comprising:

delaying said output signal by means of a delay unit connected to said frequency generator, wherein said delay unit receives a nominal parameter value signal and a parameter variation value signal for causing the delay time of said output signal to vary over time.

8. The method of claim 6, further comprising:

setting a pulse width of said output signal by means of a pulse width unit connected to said frequency generator, wherein said pulse width unit receives a nominal parameter value signal and a parameter variation value signal for causing said pulse width of said output signal to vary over time.

9. The method of claim 6, wherein said parameter is selected from the group consisting of: frequency, delay time and pulse width of said output signal.

10. A timing generator comprising:

a frequency generator for generating an output signal, said frequency generator receiving both a nominal parameter setting value for setting a nominal value of a parameter of said output signal and a predefined parameter setting value for modifying said nominal parameter setting value to cause said output signal to vary with time in order to emulate a signal being subject to at least one deviation.

11. The timing generator according to claim 10, wherein said deviation is at least one selected from the group consisting of: random jitter, synchronization jitter and timing impairs.

* * * * *